United States Patent [19]

Motonami et al.

[11] Patent Number: 5,240,872
[45] Date of Patent: Aug. 31, 1993

[54] METHOD OF MANUFACTURING SEMICONDUCTOR DEVICE HAVING INTERCONNECTION LAYER CONTACTING SOURCE/DRAIN REGIONS

[75] Inventors: Kaoru Motonami; Natsuo Ajika; Atsushi Hachisuka; Yoshinori Okumura; Yasushi Matsui, all of Hyogo, Japan

[73] Assignee: Mitsubishi Denki Kabushiki Kaisha, Tokyo, Japan

[21] Appl. No.: 925,148

[22] Filed: Aug. 6, 1992

Related U.S. Application Data

[62] Division of Ser. No. 690,824, Apr. 26, 1991, Pat. No. 5,173,752.

[30] Foreign Application Priority Data

May 2, 1990 [JP] Japan .................. 2-116274
Feb. 20, 1991 [JP] Japan .................. 3-26543

[51] Int. Cl.⁵ ........................................... H01L 21/70
[52] U.S. Cl. .......................................... 437/52; 437/44; 437/47; 437/48; 437/60; 437/919
[58] Field of Search .............. 437/44, 47, 48, 52, 437/60, 228, 235, 919

[56] References Cited

U.S. PATENT DOCUMENTS

| | | |
|---|---|---|
| 4,587,718 | 5/1986 | Haken et al. |
| 4,735,680 | 4/1988 | Yen |
| 4,910,168 | 3/1990 | Tsai |
| 4,949,136 | 8/1990 | Jain |
| 4,977,102 | 12/1990 | Ema ............................. 437/919 |
| 5,006,481 | 4/1991 | Chan et al. |
| 5,023,683 | 6/1991 | Yamada |
| 5,061,651 | 10/1991 | Imo ............................. 437/919 |

FOREIGN PATENT DOCUMENTS

| | | |
|---|---|---|
| 0218408 | 9/1986 | European Pat. Off. |
| 0334761 | 3/1989 | European Pat. Off. |
| 0365492 | 10/1989 | European Pat. Off. |
| 0318277 | 11/1989 | European Pat. Off. |

OTHER PUBLICATIONS

Kimura et al, "A New Stacked Capacitor DRAM Cell . . . ", IEEE International Electron Devices Meeting, 1988 pp. 596–599.

"Novel Stacked Capacitor Cell for 64 Mb DRAM", Wakamiya, et al., VLSI Technology Symposium, 1989, pp. 69–70.

Primary Examiner—Tom Thomas
Attorney, Agent, or Firm—Lowe, Price, LeBlanc & Becker

[57] ABSTRACT

A semiconductor device includes a MOS type field effect transistor whose gate electrode (4) has its surface covered with a first insulating film (5) and left and right sides provided with a pair of second insulating films (10). A first conductive layer (12, 13) is formed on the surface of the source/drain region (8, 11) and the surface of one of a pair of second insulating films (10) which are positioned on one side of the gate electrode (4). A third insulating film (24b) is formed at least on the surface of the second insulating film (10) on which the first conductive layer (12, 13) is not formed. A second conductive layer (18) is provided on the surface of the third insulating film (24b) and on the source/drain region (8, 11) on which the third insulating film (24b) is formed. This structure enables provision of a semiconductor device in which a contact hole can be formed in self-alignment, independent from the influence of errors in the step of patterning a resist mask.

4 Claims, 13 Drawing Sheets

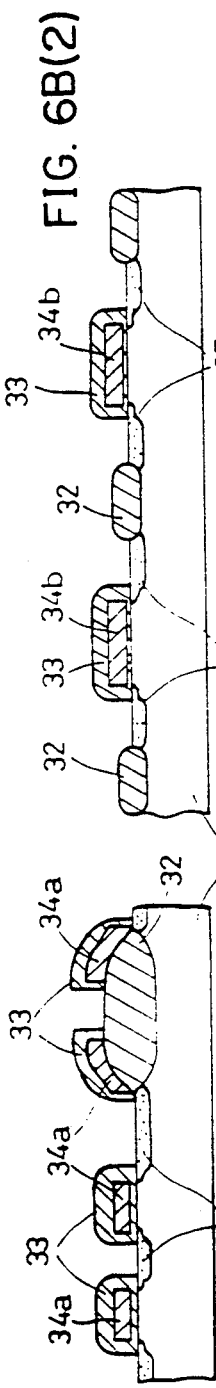
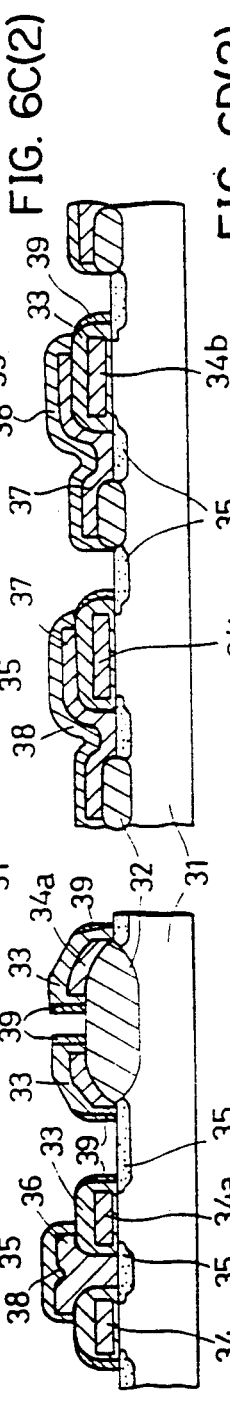
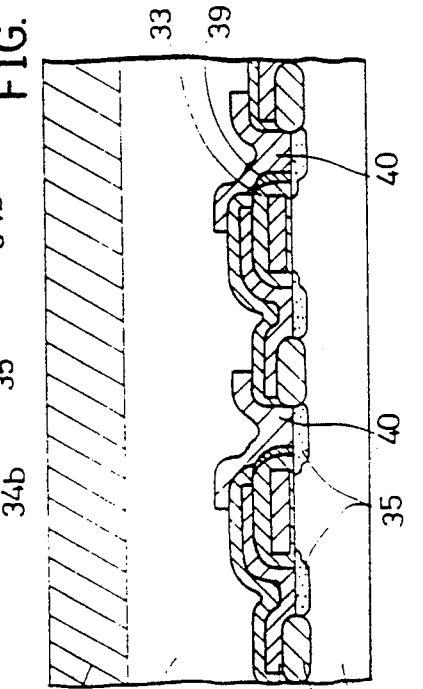
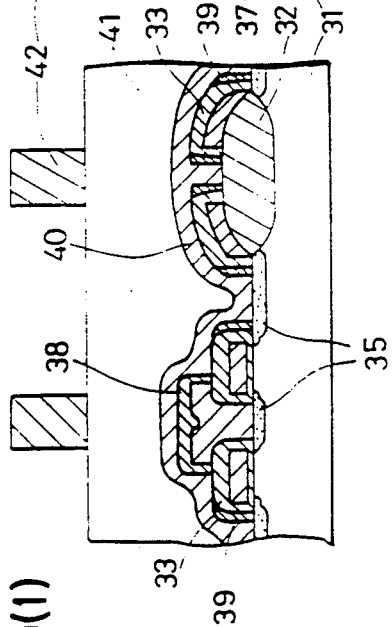
FIG. 6A(1)  FIG. 6B(1)  FIG. 6C(1)  FIG. 6D(1)
FIG. 6A(2)  FIG. 6B(2)  FIG. 6C(2)  FIG. 6D(2)

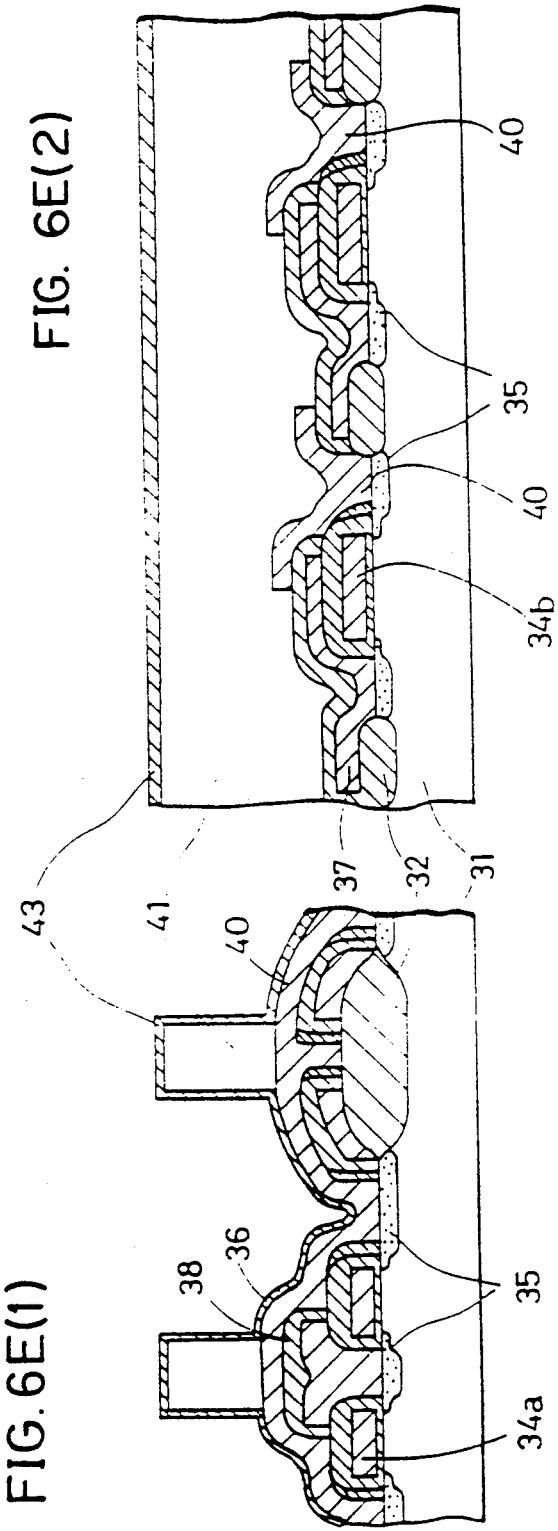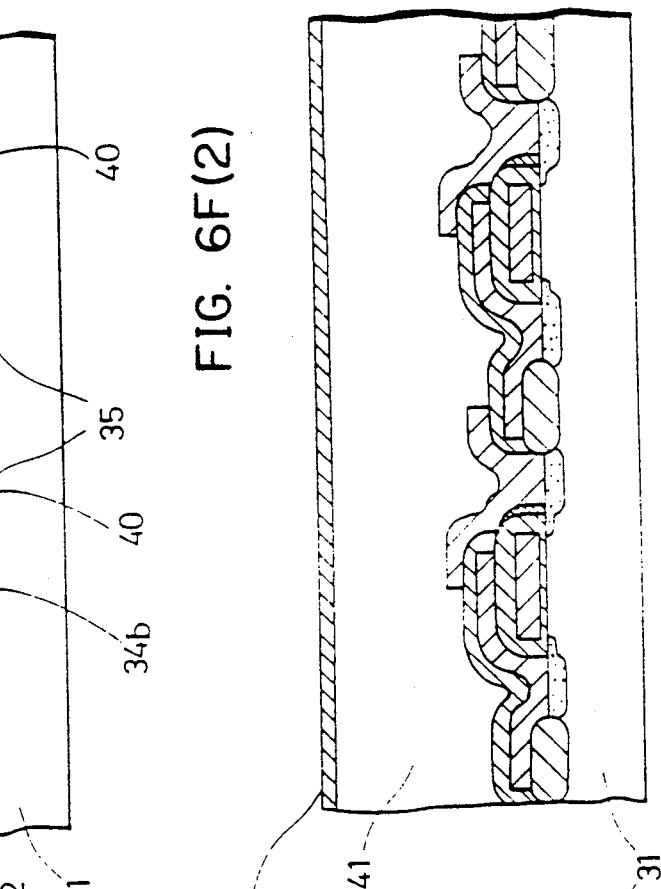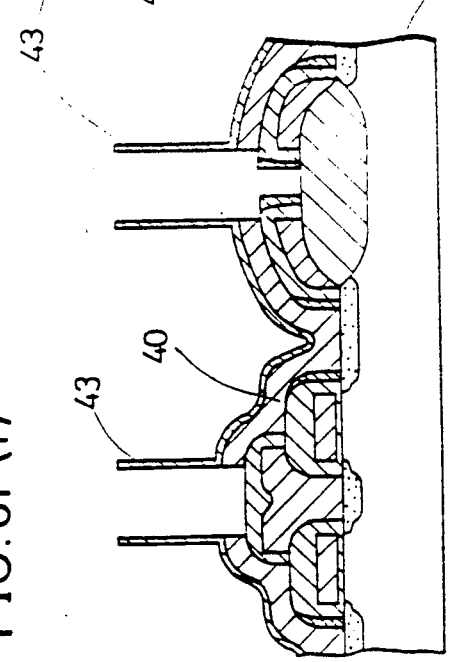

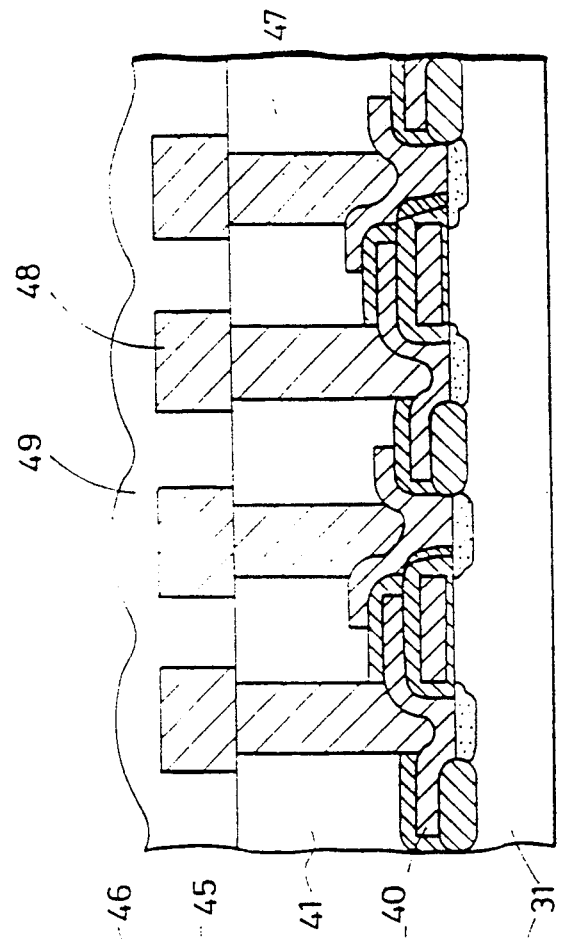
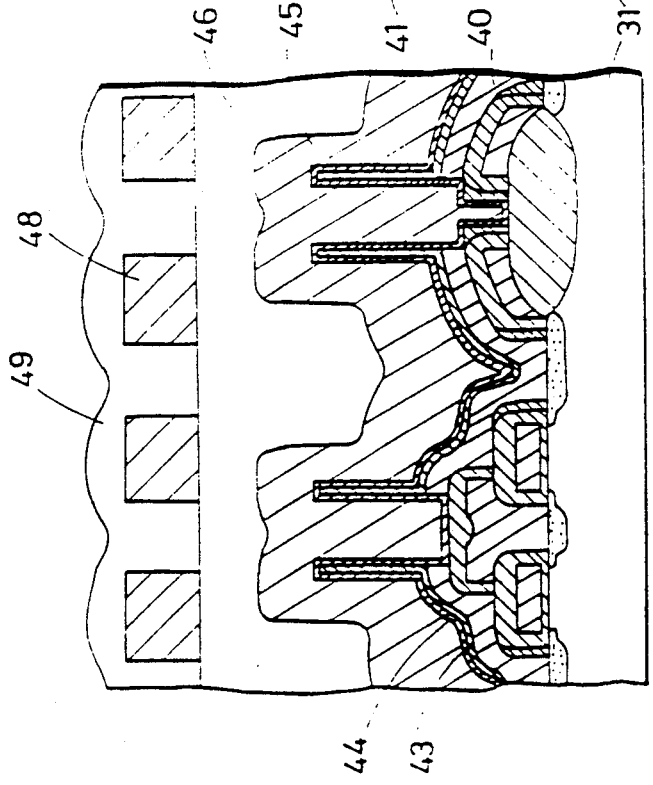

METHOD OF MANUFACTURING SEMICONDUCTOR DEVICE HAVING INTERCONNECTION LAYER CONTACTING SOURCE/DRAIN REGIONS

This application is a division of application Ser. No. 07/690,824 filed Apr. 26, 1991, now U.S. Pat. No. 5,173,752.

BACKGROUND OF THE INVENTION

1. Field of the Invention

The present invention relates to semiconductor devices used for semiconductor memories and for peripheral circuits thereof, and to a manufacturing method thereof. More specifically, the present invention relates to manufacturing of a semiconductor device having an interconnection layer providing contacts with source/drain regions of a MOS (Metal Oxide Semiconductor) field effect transistor, and to a method for effectively manufacturing the same.

2. Description of the Background Art

A structure having an interconnection layer providing contacts with source/drain regions on a surface of a MOS field effect transistor has been used in various semiconductor devices such as semiconductor memories including DRAMs (Dynamic Random Access Memories) and peripheral circuits thereof.

The steps of manufacturing a conventional semiconductor device will be described with reference to FIGS. 1A to 1J, taking a memory cell portion of a DRAM as an example.

First, a field insulating film 2 is formed on a main surface of a p type semiconductor substrate 1 by a so called LOCOS (Local Oxidation of Silicon) method to isolate and insulate an active region. Thereafter, a gate insulating film 3, a polycrystalline silicon layer 4 formed by the CVD method and an insulating film 5 are formed successively on the surface of the semiconductor substrate 1. Thereafter, a resist mask 6 is formed on the surface of the insulating film 5 into a prescribed pattern by photolithography (FIG. 1A).

Thereafter, the insulating film 5, the polycrystalline silicon layer 4 and the gate insulating film 3 except those below the resist mask 6 are successively and selectively removed by etching, so as to form a gate electrode 7. Thereafter, n type impurity ions such as phosphorus or arsenic are irradiated on the entire surface of the semiconductor substrate 1, so as to provide n type impurity diffused regions 8 of low concentration, using the gate electrode 7 as a mask (FIG. 1B).

Thereafter, an insulating film 9 is deposited on the entire surface of the semiconductor substrate 1 (FIG. 1C).

Thereafter, side wall spacers 10 are formed on both sides of the gate electrode by anisotropically etching the insulating film 9. Thereafter, n type impurity ions such as phosphorus or arsenic are irradiated on the entire surface of the semiconductor substrate 11, so as to form n type impurity regions 11 of high concentration, using the gate electrode 7 and the sidewall spacers 10 as masks (FIG. 1D).

Thereafter, a barrier metal layer 12 and a metal interconnection layer 13 are successively formed on the entire surface of the semiconductor substrate 1, and a resist mask 14 is formed by patterning (FIG. 1E). Thereafter, the metal interconnection layer 13 and the barrier metal layer 12 except those below the resist mask 14 are removed by etching. Thereafter, the resist mask 14 is removed (FIG. 1F), an interlayer insulating film 15 is formed on the entire surface of the semiconductor substrate 1, and a resist mask 16 for forming contact holes is patterned on the surface thereof (FIG. 1G). By etching the interlayer insulating film 16 in this state, contact holes 17 are formed, and then the resist mask 16 is removed (FIG. 1H).

Thereafter, a polycrystalline silicon layer 18 doped with impurities is formed by the CVD method on the entire surface of the semiconductor substrate 1, and a resist mask 19 is patterned on the surface thereof (FIG. 1I). By etching the polycrystalline silicon layer 18 in this state, patterning of interconnection is carried out, and then the resist mask 19 is removed (FIG. 1J).

In the memory cell manufactured through the above described steps, the gate electrodes 7 serve as word lines, and the metal interconnection layer 13 serves as a bit line. The polycrystalline silicon layer 18 serves as a lower electrode (storage node) of a capacitor (not shown) formed in the succeeding steps. The position of the contact portion 20 between the n type impurity diffused region 11 of high concentration and the polycrystalline silicon layer 18 is determined by patterning and etching of the resist mask 16. The width $s_1$ and $s_2$ of the left and right sidewall spacers 10 on the surface of the semiconductor substrate 1 are approximately the same, and only on the side of the polycrystalline silicon layer 18 an interlayer insulating film 15 having the width of $s_3$ is provided. Accordingly, the distance between the contact portion 21 and the n type impurity diffused region 11 of high concentration is shorter than the distance between the contact portion 20 and the n type impurity diffused region 11 on the surface of the semiconductor substrate 1, by about $s_3$. By ensuring longer distance between the contact portion 20 and the gate electrode 7 in this manner, degradation of characteristics caused by diffusion of the impurities doped in the polycrystalline silicon layer 18 to the active region is suppressed.

However, the conventional method of manufacturing the semiconductor device has the following disadvantages.

If the patterning of the resist mask 16 is out of position as shown in FIG. 2A due to patterning error during photolithography of the resist mask 16 to form the contact holes 17, the state of FIG. 2B corresponding to FIG. 1I of the prior art and then the state of FIG. 2C corresponding to FIG. 1J result. In this case, if the patterning error of the resist mask 16 exceeds $s_3$ of FIG. 1J, the distance $s_4$ between the contact portion 20 and the gate electrode 7 on the surface of the semiconductor substrate 1 becomes shorter than $s_2$ shown in FIG. 1J, as shown in FIG. 2C. Since the distance $s_4$ is shorter than the distance $s_1$ between the contact portion 21 and the gate electrode 7, degradation of characteristics caused by diffusion of impurities doped in the polycrystalline silicon layer 18 to the active region becomes a serious problem.

More specifically, the impurities doped in the polycrystalline silicon layer 18 are diffused to the active region of the semiconductor substrate 1 to reach the n type impurity diffused region 8 of low concentration, thereby increasing the concentration thereof. Therefore, electric field releasing effect realized by moderate change in concentration of the source/drain regions near the channel region is reduced, and hence peak electric field strength is increased.

If a metal interconnection is used instead of the polycrystalline silicon layer 18, the impurities are not diffused. However, since the distance between the metal interconnection and the polysilicon layer 18 of the gate electrode 7 becomes short, insulation therebetween may be degraded, and there may possibly be a short circuit in the worst case, making the whole device defective. If the metal interconnection layer is positioned to be in contact with the surface of the n type impurity diffused region 8 of low concentration, there is a possibility of so called alloy spike, in which the metal interconnection layer piercing through the n type impurity diffused region 8 of low concentration directly reacts with the silicon in the semiconductor substrate 1. If the alloy spike is generated, insulation between the metal interconnection layer and the semiconductor substrate would be degraded.

SUMMARY OF THE INVENTION

An object of the present invention is to provide a semiconductor device having a contact hole formed in self-alignment, not influenced by errors in patterning of a resist mask, and to provide a manufacturing method thereof.

The semiconductor device of the present invention has the following structure. The semiconductor device of the present invention includes a semiconductor substrate having an active region of a first conductivity type near the surface thereof, a gate electrode formed on the surface of the active region of the semiconductor substrate with a gate insulating film interposed therebetween, a first insulating film covering the upper surface of the gate electrode, and impurity diffused regions of a second conductivity type formed near the surface of the semiconductor substrate extending outward from directly below the left and right sides of the gate electrode. A pair of second insulating films are deposited on the left and right sides of the gate electrode, and a first conductive layer is formed on the surfaces of one of the pair of second insulating films and one of the impurity regions, which are positioned on one side of the gate electrode. A third insulating film is formed at least on the surface of the second insulating film on the side where the first conductive layer is formed. A second conductive layer is provided on the surface of the third insulating film and on the surface of the impurity diffused region on the side where the third insulating film is formed.

In the semiconductor device of the present invention, the distance between the second conductive layer and the gate electrode is made larger than that between the first conductive layer and the gate electrode. Therefore, when the first conductive layer is formed by a metal interconnection layer and the second conductive layer is formed by a polycrystalline silicon layer doped with impurities, the degradation of characteristics due to diffusion of impurities from the second conductive layer to the active region, that is, increase of peak electric field strength can be suppressed. Even if a metal interconnection is used as the second conductive layer, disadvantages such as short circuits derived from small distance between the second conductive layer and the gate electrode or reaction of metal in the second conductive layer piercing through the impurity diffused region with the silicon in the semiconductor substrate can be prevented, since the distance between the second conductive layer and the gate electrode is surely made larger than at least the thickness of the second insulating film.

In the method of manufacturing the semiconductor device in accordance with the present invention, at least a gate electrode having its upper portion covered with a first insulating film is formed on an active region of a first conductivity type of a semiconductor substrate, with a gate insulating film posed therebetween. Then an insulating film is deposited on the entire surface of the semiconductor substrate, and anisotropic etching is carried out to form a pair of second insulating films on left and right sides of the gate electrode. Thereafter, impurity ions of a second conductivity type are irradiated to the entire surface of the semiconductor substrate to form impurity diffused regions, by using the gate electrode or gate electrode and the second insulating film as masks. Thereafter, a first conductive layer with upper surface covered with an insulating film is selectively formed extending from at least a prescribed position on the surface of the gate electrode to a surface of one of the pair of second insulating films and to the surface of the impurity diffused region adjacent thereto. Thereafter, an insulating film is deposited on the entire surface of the semiconductor substrate, and anisotropic etching is done to form a third insulating film on end portions of the gate electrode on the second conductive layer and on the surface of one of the pair of first insulating films which does not have the first conductive layer formed thereon. Thereafter, a second conductive layer is selectively formed at least on the surface of the third insulating film and on the surface of one of the impurity diffused regions which does not have the first conductive layer formed thereon.

The third insulating film may be formed by covering the position on the semiconductor substrate where the first conductive layer is to be formed with a resist mask before forming the first conductive layer, depositing an insulating film on the entire surface of the semiconductor substrate, and by anisotropically etching the same.

In accordance with the manufacturing method of the semiconductor device in accordance with the present invention, by forming a third insulating film on a surface of one of the pair of second insulating films, the contact portion between the second conductive layer and the surface of the impurity diffused region can be formed in self-alignment. Therefore, the position of the contact portion can be determined independent from the influence of patterning error of the resist mask, and therefore the semiconductor device having the above described structure can be manufactured with high efficiency.

Preferably, the third insulating film may be formed of a material having higher selectivity to etching than the material of the first insulating film. This suppresses reduction in thickness of the first insulating film during anisotropic etching for forming the third insulating film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A(1), 6A(2) through 6G(1), 6G(2) are cross sectional views showing, in this order, the steps of manufacturing a semiconductor device in accordance with a second embodiment of the present invention.

DESCRIPTION OF THE PREFERRED EMBODIMENTS

The first embodiment of the present invention will be described with reference to FIGS. 3A and 3B and FIGS. 4A to 4J. In this embodiment, the present invention is applied to a memory cell portion of a DRAM.

Figure 4A:
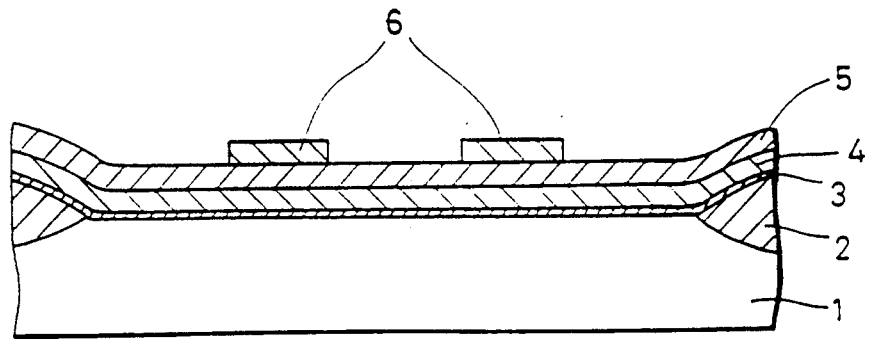
FIGS. 4A, 4B, 4C, 4D, 4E, 4F, 4G, 4H, 4I and 4J are cross sectional views showing, in this order, the steps of manufacturing a semiconductor device in accordance with a first embodiment of the present invention.

In the manufacturing process of the present embodiment, first, a field insulating film 2 is formed by the LOCOS method to isolate and insulate an active region. Thereafter, a gate insulating film 3, a polycrystalline silicon layer 4 formed by the CVD method, and an insulating film 5 are formed in this order on the surface of the semiconductor substrate. Thereafter, a resist mask 6 is formed by photolithography at a position where a gate electrode is to be formed, on the surface of the insulating film 5 (FIG. 4A).

Figure 4B:
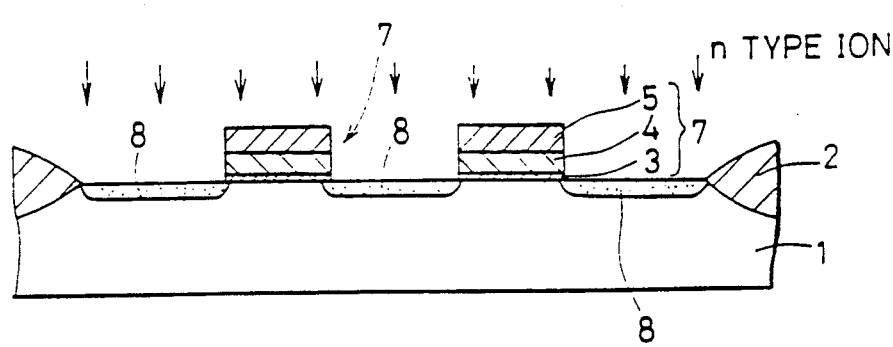

Thereafter, the insulating film 5, the polycrystalline silicon layer 4 and the gate insulating film 3 except those below the resist masks 6 are successively and selectively removed by etching, so as to form a gate electrode 7, which will serve as a word line of the memory cell. Thereafter, n type impurity ions such as phosphorus or arsenic are irradiated to the entire surface of the semiconductor substrate 1, and n type impurity diffused regions 8 of low concentration are formed by using the gate electrode 7 as a mask (FIG. 4B).

Figure 4C:
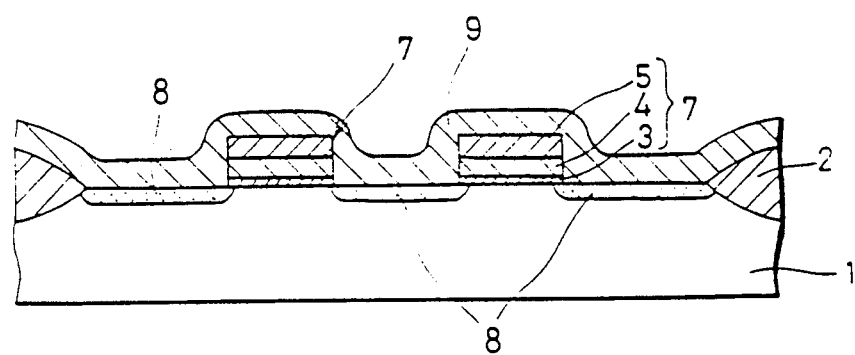

Thereafter, an insulating film 9 is deposited on the entire surface of the semiconductor substrate 1 (FIG. 4C). Thereafter, anisotropic etching is effected on the insulating film 9 to form sidewall spacers 10 on left and right sidewalls of the gate electrode. Then, n type impurity ions such as phosphorus or arsenic are irradiated to the entire surface of the semiconductor substrate 1 to form n type impurity diffused regions 11, by using the gate electrodes 7 and the sidewall spacers 10 as masks (FIG. 4D).

The steps shown in FIGS. 4A to 4D are the same as the steps shown in FIGS. 1A to 1D of the prior art.

Figure 4D:
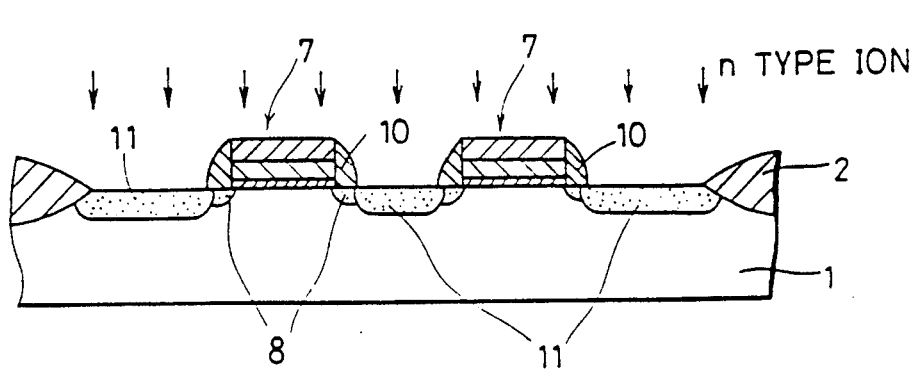
Figure 4E:
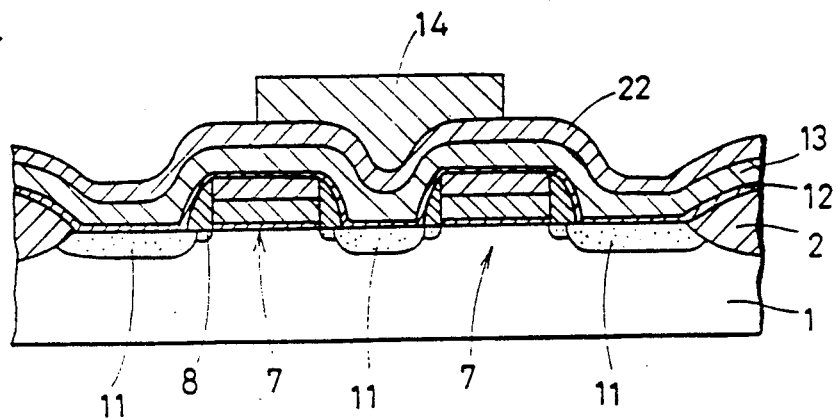
Figure 4F:
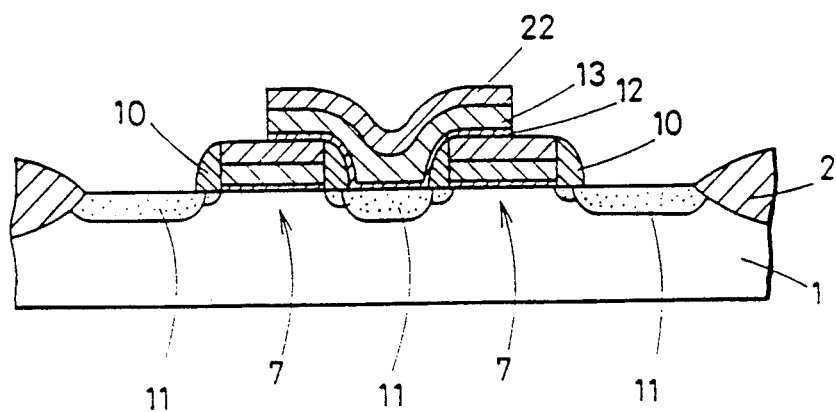

In the present embodiment, after the structure of FIG. 4D is provided, a barrier metal layer 12 and a metal interconnection layer 13 are successively formed on the entire surface of the semiconductor substrate 1, an insulating film 22 is further formed on the entire surface thereof, and a resist mask 14 is further formed thereon by patterning (FIG. 4E). In this state, the oxide insulating film 22, the metal interconnection layer 13 and the barrier metal layer 12 are etched successively, and then the resist mask 14 is removed (FIG. 4F). The metal interconnection layer 13 constitutes a first conductive layer, which will serve as a bit line of the memory cell, in the present embodiment.

Figure 4G:
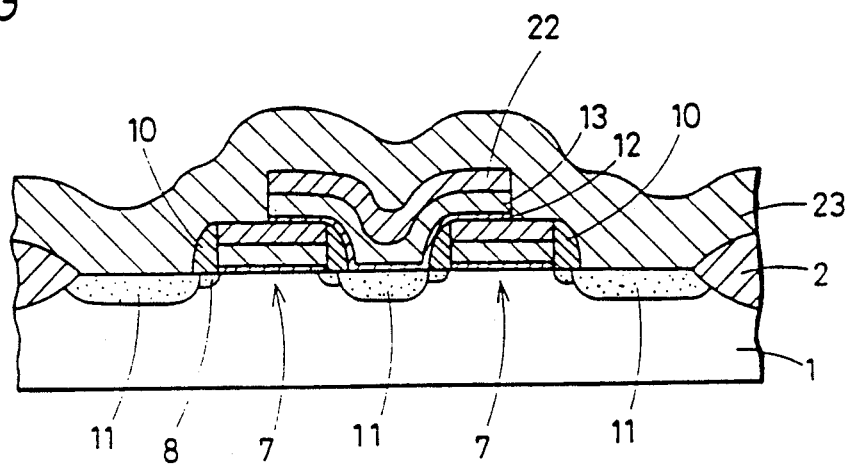
Figure 4H:
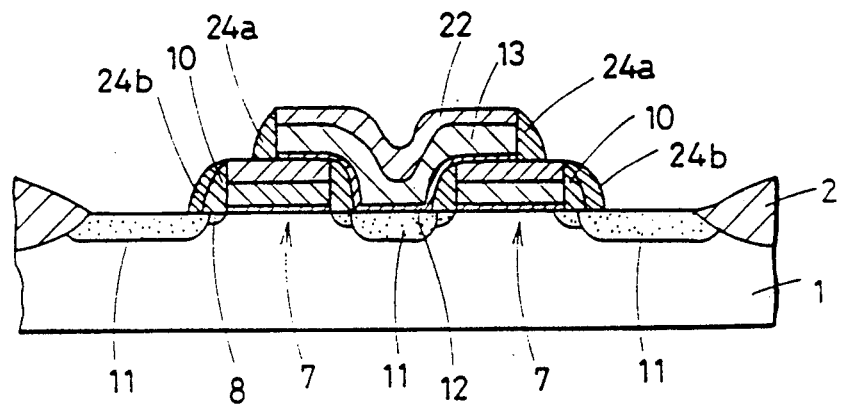

Then, an insulating film 23 is deposited on the entire surface of the semiconductor substrate 1 (FIG. 4G). Thereafter, by effecting anisotropic etching on the insulating film 23, an insulating film 24a is left on an end portion of the metal interconnection layer 13, and an insulating film 24b is left on the surface of the sidewall spacer 10 on the side where the metal interconnection layer 13 has been removed (FIG. 4H).

Figure 4I:
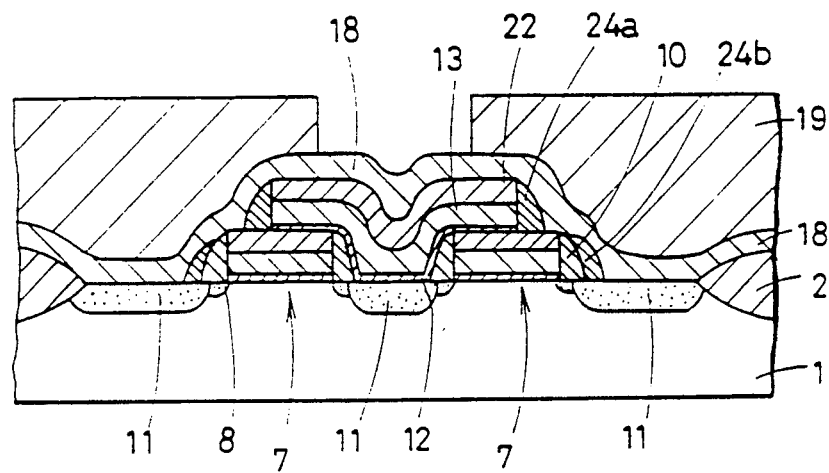

Thereafter, a polycrystalline silicon layer 18 doped with impurities is deposited by the CVD method on the entire surface of the semiconductor substrate 1. Impurities have been implanted to have the concentration not lower than $10^{20}/cm^3$ in the polycrystalline silicon layer 18. Thereafter, a resist mask 19 is formed by patterning on the polycrystalline silicon layer 18 (FIG. 4I). By etching the polycrystalline silicon layer 18 in this state, the polycrystalline silicon layer 18 is patterned to provide a second conductive layer, which will serve as a lower electrode (storage node) of the memory cell, in the present embodiment (FIG. 4J).

Figure 1A:
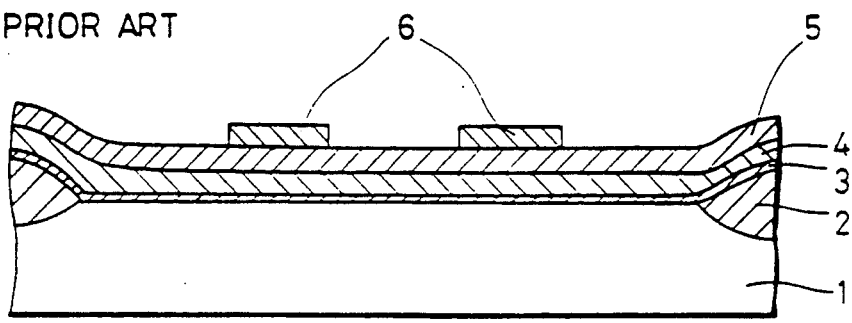
FIGS. 1A, 1B, 1C, 1D, 1E, 1F, 1G, 1H, 1I and 1J are cross sectional views showing in this order the steps of manufacturing a memory cell portion of a conventional DRAM.
Figure 1B:
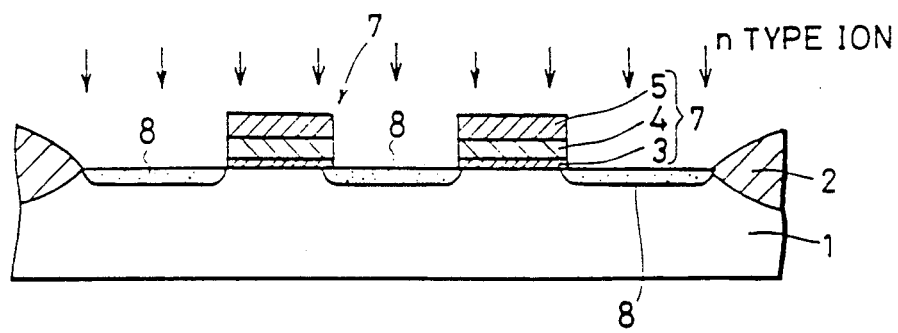
Figure 1C:
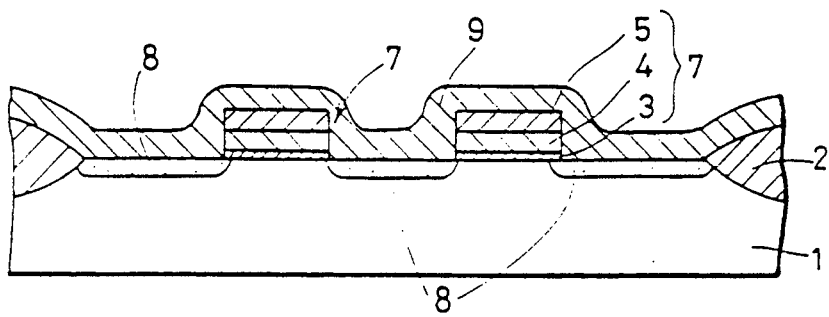
Figure 1D:
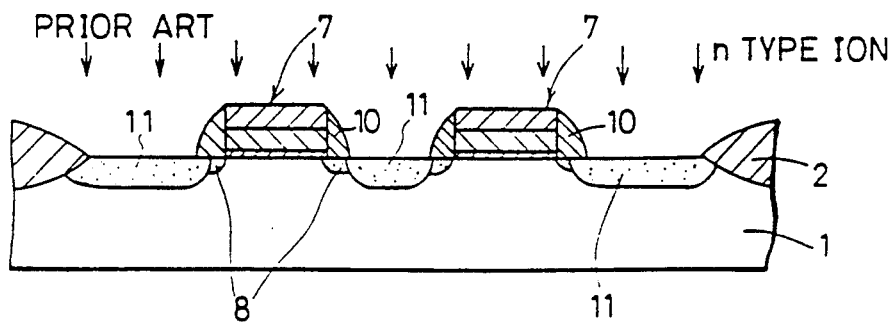
Figure 1E:
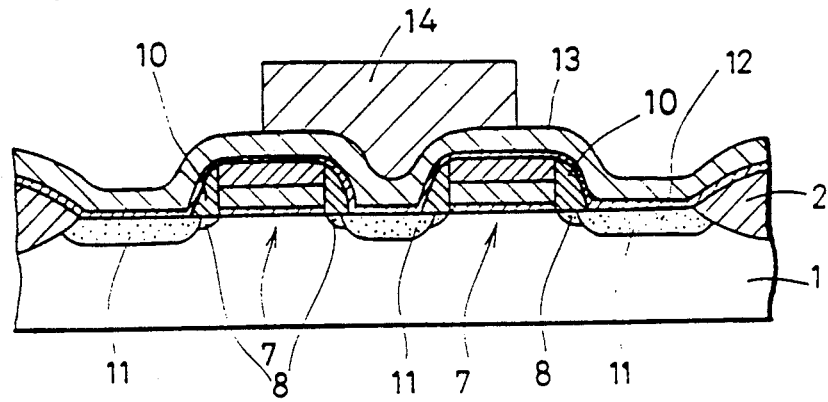
Figure 1F:
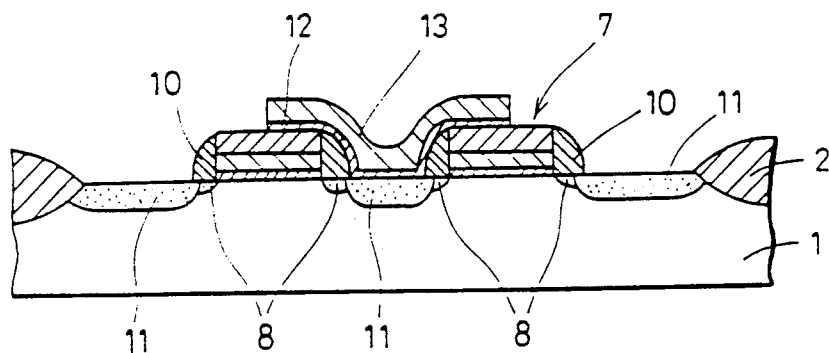
Figure 1G:
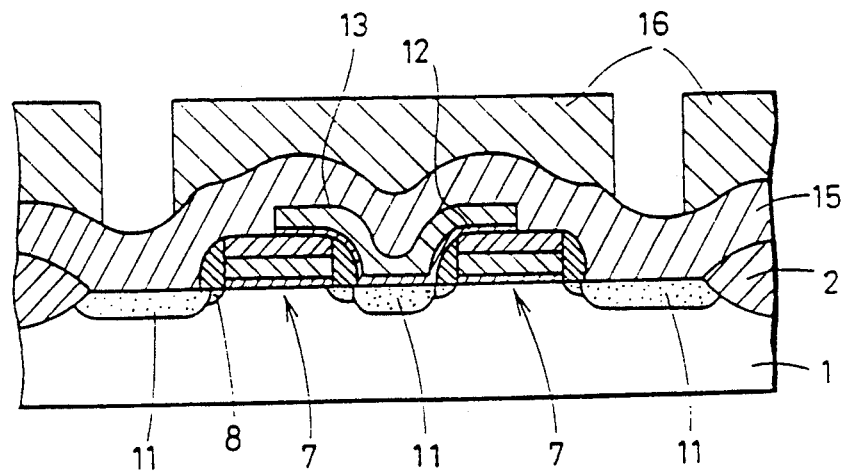
Figure 1H:
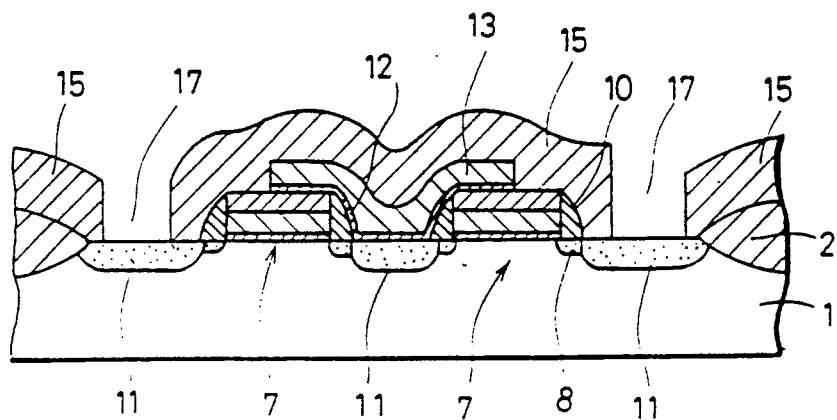
Figure 1I:
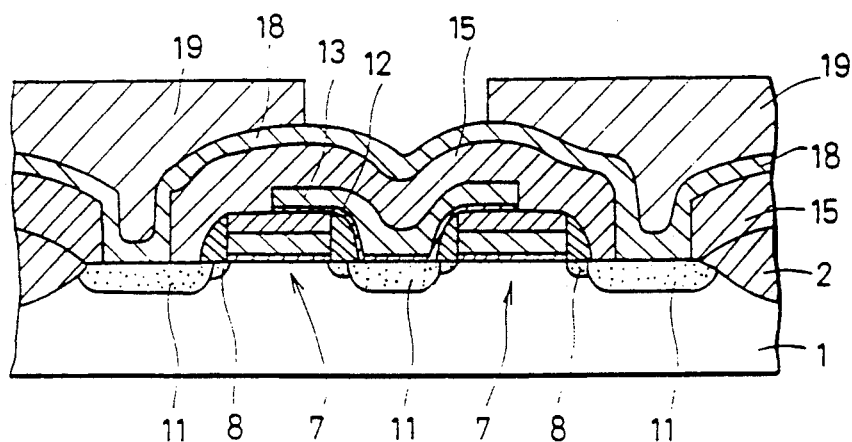
Figure 1J:
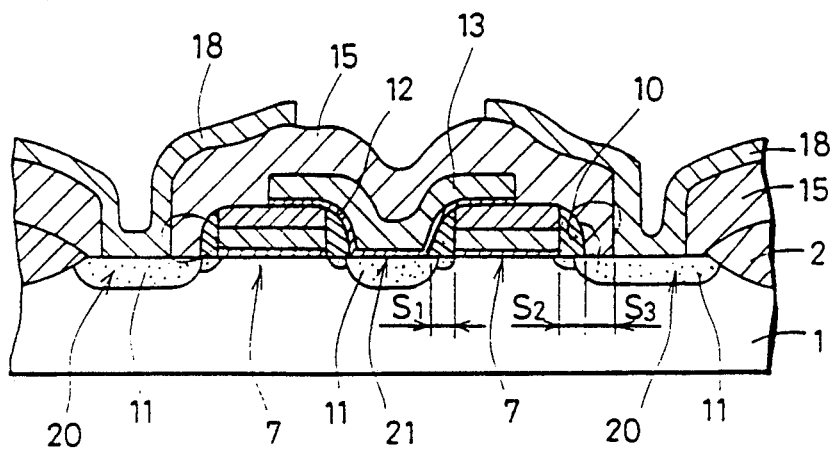
Figure 2A:
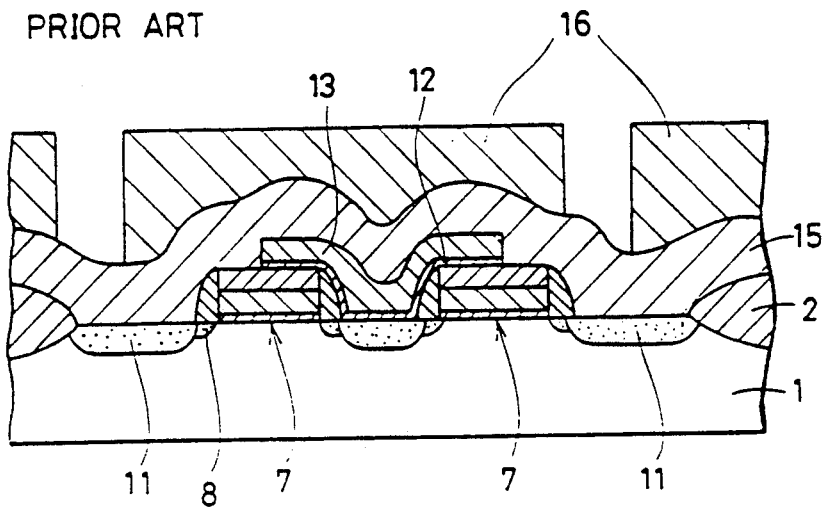
FIGS. 2A, 2B and 2C illustrate problems in the method of manufacturing the memory cell portion of the conventional DRAM, showing cross sections at respective steps in this order when patterning of the resist mask gets out of position.
Figure 2B:
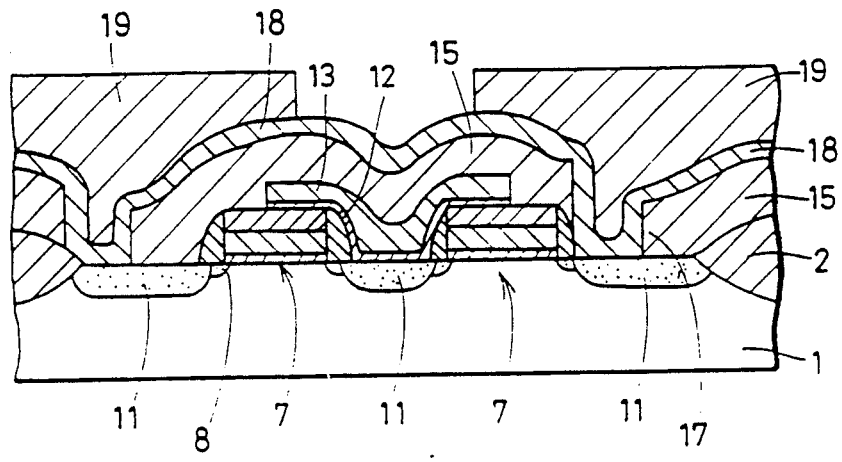
Figure 2C:
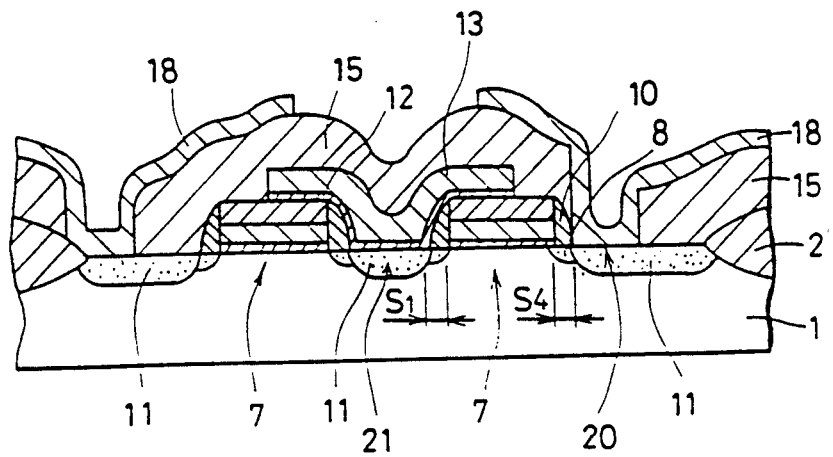
Figure 3A:
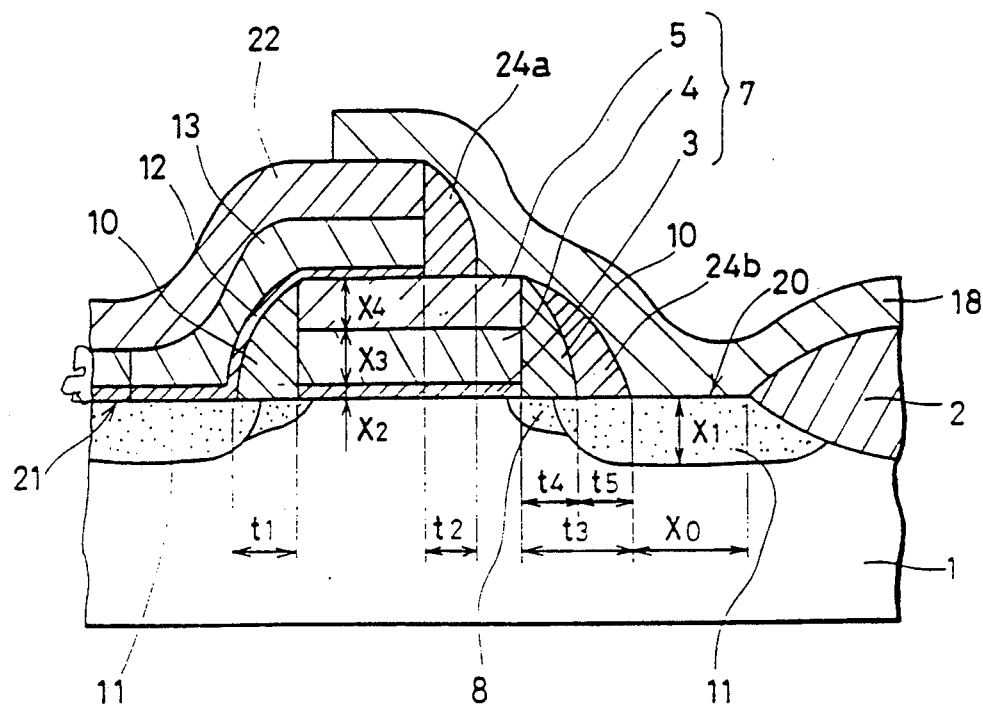
FIGS. 3A is a cross sectional view showing, in enlargement, a main portion of a semiconductor device in accordance with a first embodiment of the present invention.
Figure 4J:
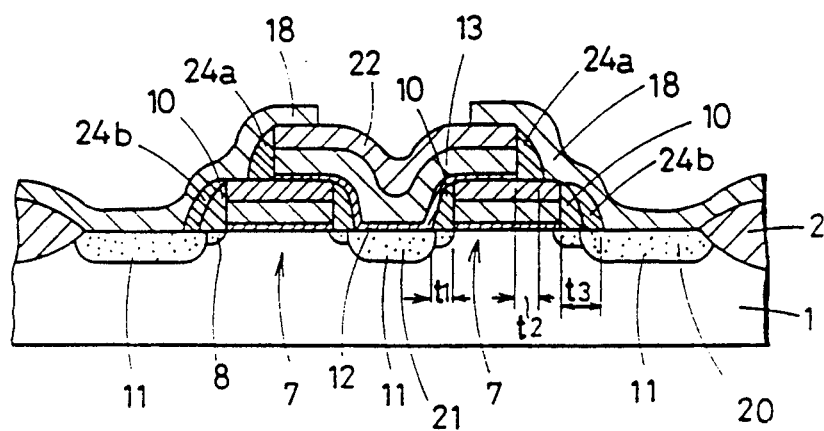

In the structure shown in FIG. 4J formed through the above described steps, if the thickness of the barrier metal layer 12, the metal interconnection layer 13 and the insulating film 22 in total is approximately the same as the thickness of the polycrystalline silicone layer 4, the insulating film 5 and the gate electrode 7 in total, the thickness $t_1$ of the sidewall spacer 10 is approximately the same as the thickness $t_2$ of the insulating film 24a, and the thickness $t_3$ of the sidewall spacer 10 and the insulating film 24b in total is approximately the same as the sum of $t_1$ and $t_2$, as shown in an enlargement in FIG. 3A. Accordingly, the distance between the contact portion 20 between the polycrystalline silicon layer 18 and the n type impurity diffused region 11 of high concentration and the gate electrode 7 becomes $t_3$, which is surely larger than the distance $t_1$ between the contact between the metal interconnection layer 13 and the n type impurity diffused region 11 of high concentration and the gate electrode 7. Consequently, positioning of the contact portion 20 ensuring sufficient space from the gate electrode 7 can be done in self-alignment, and degradation of characteristics due to the diffusion of impurities doped in the polycrystalline silicon layer 18 to the active region can be suppressed.

Figure 3B:
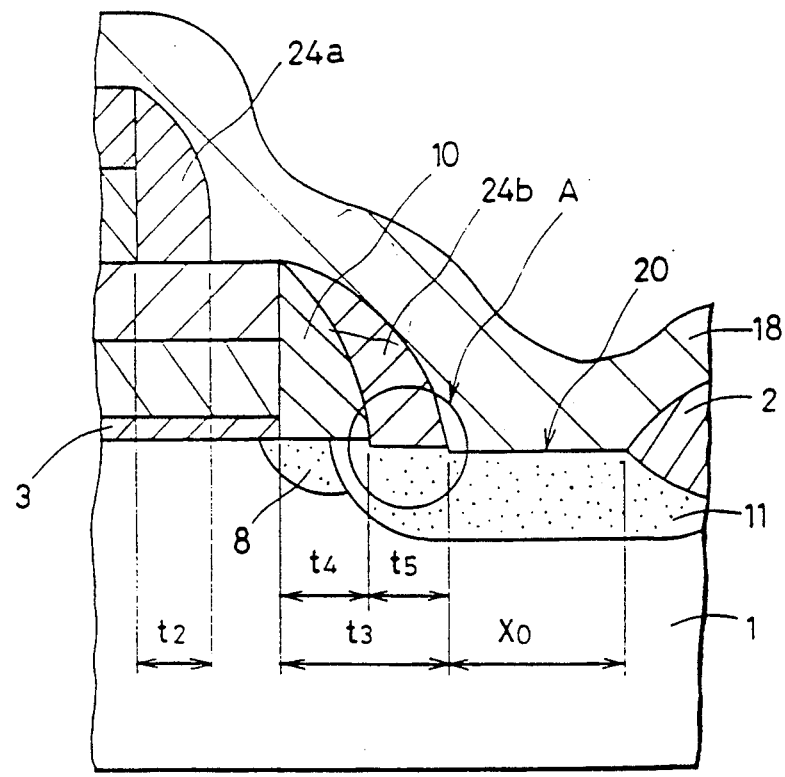
FIG. 3B is a partial enlargement thereof.

The bottom surfaces of the sidewall spacers 10, the insulating film 24b and of the polycrystalline silicon layer 18 have small steps as shown in a circle A of FIG. 3B, since the surface of the semiconductor substrate is scraped gradually by etching during the manufacturing process.

The most preferable specifications and approximate impurity concentrations when the present embodiment is applied to a memory cell of a 64 megabit DRAM are as shown in the Table below.

TABLE

| | |
|---|---|
| $x_0$ | 0.2 μm |
| $x_1$ | not higher than 0.15 μm |
| $x_3$ | 1000Å |
| $x_4$ | 1500Å |

TABLE-continued

| | |
|---|---|
| $t_1(t_4)$ | 1000Å |
| $t_2$ | 1000Å |
| $t_5$ | $0.7 x_1 – 0.8 x_1$ |
| impurity concentration of n-region 11 of high concentration | $4 \times 10^{20}/cm^3$ |
| impurity concentration of polycrystalline silicon layer 4 | $4 \times 10^{20}/cm^3$ |
| impurity concentration of polycrystalline silicon layer 18 | $4 \times 10^{20}/cm3$ |

Figure 5A:
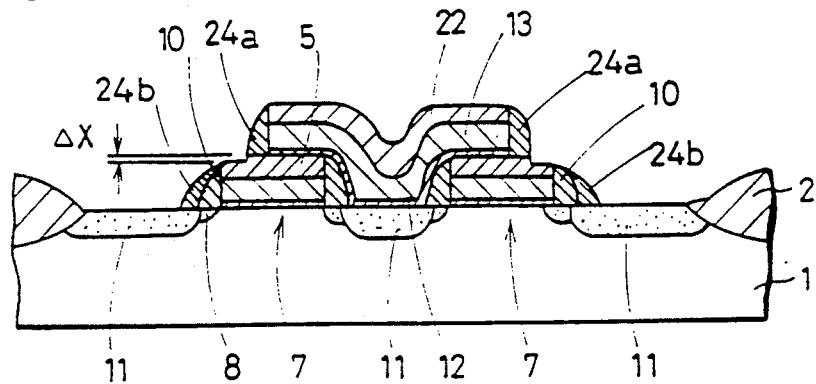
FIGS. 5A, 5B and 5C are cross sectional views corresponding to FIGS. 4H, 4I and 4J, respectively, illustrating problems caused when an insulating film 5 and an insulating film 24 are formed of materials having the same selectivity to etching, in the first embodiment of the present invention.
Figure 5B:
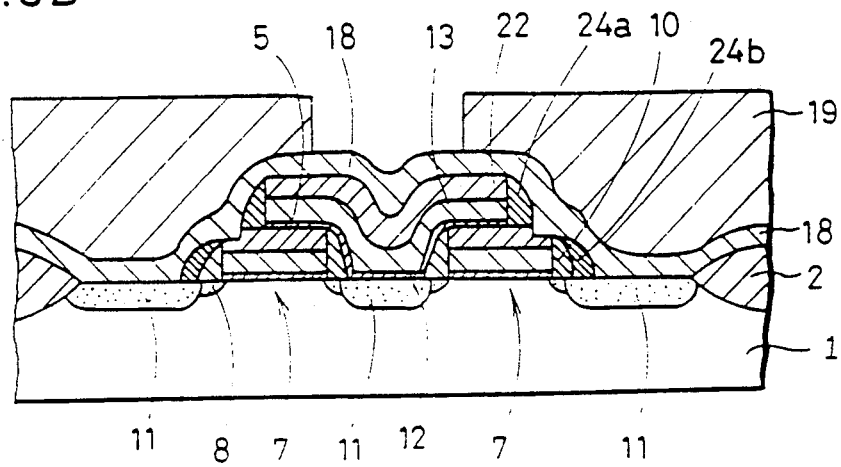

Although the materials of the insulating film 5 and the insulating film 24b are not specified in the above described first embodiment, if these films are formed of materials having approximately the same selective etch ratio, a problem such as shown in FIGS. 5A and 5B arises.

Figure 5C:
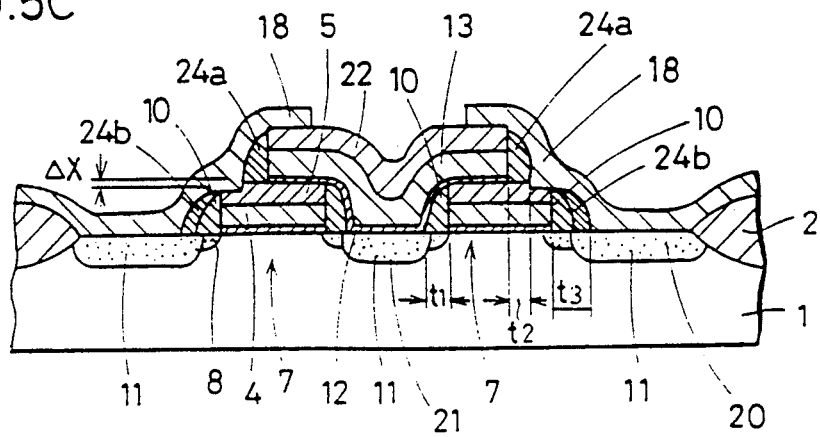

More specifically, if the insulating film 5 and the insulating film 24b are both formed of silicon oxide films, the insulating film 5 is also etched during the step of anisotropic etching for forming the insulating film 24b, since these films have the same etch ratio, and therefore, the thickness of the insulating film 5 at that portion becomes thinner by $\Delta x$ (FIG. 5A). When the polycrystalline silicon layer 18 doped with impurities is deposited in this state, the resist mask 19 is formed thereon (FIG. 5B) and the polycrystalline layer 18 is etched to a prescribed pattern, the distance between the polycrystalline silicon layer 18 as the second conductive layer and the polycrystalline silicon layer 4 of the gate electrode 7 becomes shorter (FIG. 5C). In such case, the insulation between the polycrystalline silicon layer 18 and the polycrystalline silicon layer 4 may be insufficient, dependent on the thickness $\Delta x$.

In view of the foregoing, a silicon nitride film is used as the material of the insulating film 5, and a silicon oxide film having higher selectivity to etching than the silicon nitride film is used as the material of the insulating layer 24b, whereby reduction in thickness ($\Delta x$ in the figure) of the insulating film 5 during the step of anisotropic etching for forming the insulating layer 24b can be suppressed.

A second embodiment of the present invention will be described with reference to FIGS. 6A(1), 6A(2) through 6G(1), 6G(2). In this embodiment, the present invention is applied to steps for simultaneously forming a memory cell portion of a DRAM and peripheral circuits thereof. Cross sections of the memory cell portions are shown in the figure, while the cross sections of the peripheral circuitry are shown in the figure of the respective figures, in the order of the manufacturing steps.

In the present embodiment, first, a field insulating film 32 is formed on a prescribed region on a main surface of a p type semiconductor substrate 31 to isolate and insulate an active region (FIG. 6A(1), 6A(2)).

Then, through the same steps as shown in FIGS. 4A to 4D in the above described first embodiment, a gate electrode 34a which will serve as a word line covered with an insulating film 33, a gate electrode 34b of a MOS field effect transistor in the peripheral circuitry, and n type impurity regions 35 which will be source/drain regions are formed (FIG. 6B(1), 6B(2)). Thereafter, a high melting point metal layer such as tungsten, molybdenum or titanium is deposited and patterned to a prescribed shape. Consequently, a bit line 36 as a first conductive layer which is directly in contact with the source/drain regions is formed in the memory cell portion, and a conductive interconnection layer 37 is formed in the peripheral circuitry. A high melting point metal silicide or polycide may be used as the material of the bit line 36 and the conductive interconnection layer 37. Thereafter, an insulating film is deposited to a prescribed thickness on the entire surface of the semiconductor substrate 31, and anisotropic etching is effected, so that portions around the bit line 36 and the conductive interconnection layer 37 are covered with the insulating film 38. At the same time, insulating films 39 are left at side portions of those regions of the surface of the insulating film 33 around the gate electrodes 34a and 34b at which the bit line 36 or the conductive interconnection layer 37 is not formed (FIG. 6C(1), 6C(2)). The insulating film 39 constitutes a second insulating film in this embodiment.

Thereafter, a polysilicon silicon layer 40 doped with impurities is deposited by the CVD method, the memory cell portion is left as it is, and only the peripheral circuitry is patterned to a prescribed shape. Thereafter, an insulting layer 41 of, for example, silicon oxide film is deposited thick, and a resist mask 42 is formed by patterning on the surface thereof FIG. 6D(1), 6D(2)). In this state, the insulating layer 41 only in the memory cell portion is etched, and the resist mask 42 is removed, then a polycrystalline silicon layer 43 doped with impurities is deposited on the entire surface by using the CVD method (FIG. 6E(1), 6E(2)). Thereafter, a thick resist (not shown) is applied to completely cover the polycrystalline silicon layer 43, this is etched back only on the side of the memory cell portion to remove the polycrystalline silicon layer 43 covering the upper surface of the insulating layer 41, and thereafter, the insulating layer 41 and the polycrystalline silicon layer 40 are removed by etching in select-alignment. Thereafter, the resist is removed, and thus the state of FIGS. 6F(1), 6F(2) are provided.

Then, in the memory cell portion, a dielectric layer 44 and an upper electrode (cell plate) 45 formed of conductive polycrystalline silicon or the like are formed on the entire surface, and a thick interlayer insulating layer 46 is formed thereon. In the peripheral circuit portion, a contact hole is provided at a prescribed position of the insulating layer 41, and a conductor such as tungsten or polysilicon doped with impurities is embedded therein to form a contact 47. An interconnection layer 48 of a prescribed shape formed of aluminum or the like is formed on the surface of the interlayer insulating layer, the surface of which is covered with a protective film 49, and thus the state of FIGS. 6G(1), 6G(2) are realized.

In the present embodiment, during the manufacturing steps of a DRAM, MOS field effect transistors in the memory cell portion and in the peripheral circuit portion can be simultaneously formed by applying the present invention. Therefore, the same effect as in the above described first embodiment can be provided both in the memory cell portion and in the peripheral circuit portion.

Figure 7A:
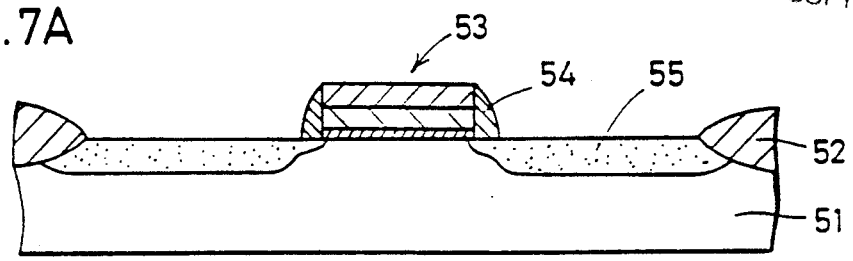
FIGS. 7A, 7B, 7C and 7D are cross sectional views showing, in this order, the manufacturing steps in another application of the present invention.
Figure 7B:
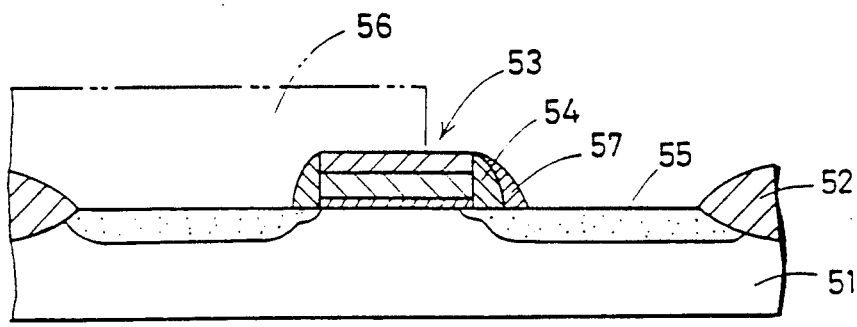
Figure 7C:
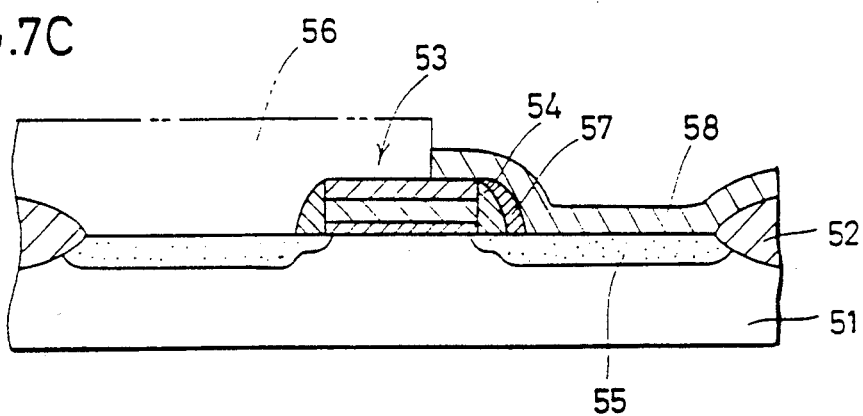
Figure 7D:
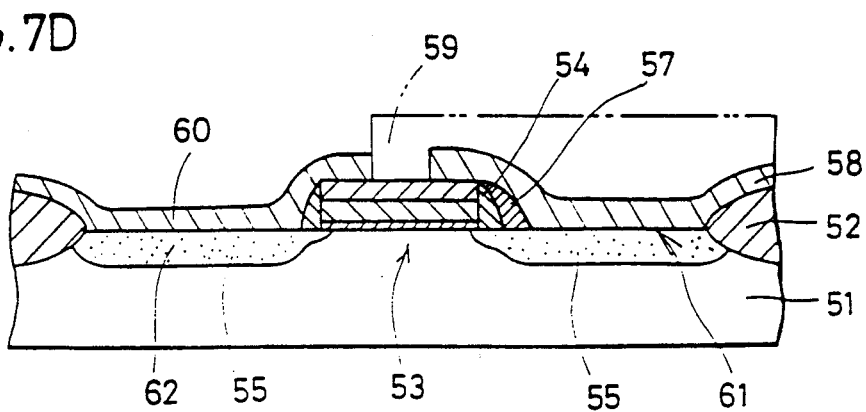

Although the first conductive layer and the second conductive layer are formed in different stages with an insulating layer formed therebetween in the above described embodiments, the present invention is not limited thereto. For example, the present invention can be applied when the first conductive layer and the second conductive layer are formed in the layers of the same level, formed through the steps shown in FIGS. 7A to 7D. In this application, first, an active region on a main surface of a p type semiconductor substrate 51 is isolated and insulated by a field insulating film 52. Namely, a gate electrode 53 is formed approximately at the center of the surface of the active region, and sidewall spacers 54 are formed on the sidewalls thereof. N type impurity diffused regions 55 doped with n type impurity ions are formed outward from directly below the left and right sidewalls of the gate electrode 53 (FIG. 7A). Then, the left side region approximately from the center of the surface of the gate electrode 53 is covered with a resist 56, and an insulating film is deposited to a prescribed thickness on the entire surface of the semiconductor substrate 51. Anisotropic etching is effected, and an insulating film 57 is left only on the surface of the sidewall spacer 57 (FIG. 7B). Then, a conductive layer 58 is formed in the active region not covered by the resist 56 (FIG. 7C). Then, only the active region on the side of the conductive layer 58 is covered with a resist 59, and a conductive layer 60 is formed on the other side of the active region (FIG. 7D).

In the structure formed through the above described steps, the distance between the contact portion 61 between the conductive layer 58 and the n type impurity diffused region 55 and the gate electrode 53 is made larger than the distance between the contact portion 62 between the conductive layer 60 and the n type impurity diffused layer 55 and the gate electrode 53, and it is formed in self-alignment. Therefore, if the conductive layer 58 is formed of a polycrystalline silicon layer doped with impurities and the conductive layer 60 is formed of a metal interconnection layer, degradation of characteristics due to diffusion of impurities from the conductive layer 58 to the active region can be suppressed.

Although formation of n channel type MOS field transistors on p type semiconductor substrates have been described in the foregoing, the present invention is not limited thereto and the same effects can be provided when the transistors and the substrates have opposite conductivity types.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:
   forming a gate electrode (7) having its upper portion covered with a first insulating film (5) on a surface of an active region of a first conductivity type of a semiconductor substrate (1), with a gate insulating film (3) formed therebetween;
   depositing an insulating film (9) on the entire surface of said semiconductor substrate (1), and anisotropically etching the same to form a pair of second insulating films (10) on left and right sides of said gate electrode (7);
   irradiating impurity ions of a second conductivity type to the entire surface of said semiconductor substrate (1) to form impurity diffused regions (8, 11) by using said gate electrode (7) only and/or by using both said gate electrode (7) and said second insulating films (10) as masks;
   after said second insulating films (10) are formed, selectively forming a first conductivity layer (12, 13) with its upper surface covered with an insulating film (22) extending at least from a prescribed position on the surface of said gate electrode (7) to a surface of one of said pair of second insulating films (10) and the surface of the impurity diffused regions (8, 11) adjacent thereto;
   after the first conductive layer (12, 13) is formed, depositing an insulating film (23) at least near a side end portion of said gate electrode (7) on which said first conductive layer (12, 13) is not formed, and anisotropically etching the same to form a third insulating film (24b) at least on the surface of one of said pair of said second insulating films (10) on which said first conductive layer (12, 13) is not formed; and
   after the third insulating film (24b) is formed, selectively forming a second conductive layer (18) at least on the surface of said third insulating film (24b) and on the surface of one of said impurity diffused regions (8, 11) on which said first conductive layer (12, 13) is not formed.

2. A method of manufacturing a semiconductor device according to claim 1, wherein
   a material having higher selectivity to etching than a material of said first insulating film (5) is used as a material of the insulating film used for forming the third insulating film (24b) which is deposited entirely on said semiconductor substrate (1) after formation of said first conductive layer (12, 13) and is subjected to anisotropic etching.

3. A method of manufacturing a semiconductor device according to claim 1, wherein
   said step of forming said third insulating film (24b) is effected by depositing, after said first conductive layer (12, 13) is formed, an insulating film (23) on the entire surface of said semiconductor substrate (1) and by anisotropically etching the same.

4. A method of manufacturing a semiconductor device according to claim 1, wherein
   said step of forming said third insulating film (24 b) is effected before forming said first conductive layer (12, 13), by covering a region of said semiconductor substrate (1), on which said first conductive layer (12, 13) is formed, with a resist mask, depositing an insulating film on the entire surface of said semiconductor substrate (1) in this state, and by anisotropically etching the same.

* * * * *